(12) United States Patent
McGough

(10) Patent No.: US 7,800,904 B2
(45) Date of Patent: Sep. 21, 2010

(54) ELECTRONIC ASSEMBLY AND HEAT SINK

(76) Inventor: William L. McGough, 81 Pondfield Rd., No. 268, Bronxville, NY (US) 10708

( * ) Notice: Subject to any disclaimer, the term of this patent is extended or adjusted under 35 U.S.C. 154(b) by 0 days.

(21) Appl. No.: 12/348,281

(22) Filed: Jan. 3, 2009

(65) Prior Publication Data

US 2009/0180254 A1    Jul. 16, 2009

Related U.S. Application Data

(60) Provisional application No. 61/011,185, filed on Jan. 15, 2008.

(51) Int. Cl.
*H05K 7/20*    (2006.01)
*G06F 1/20*    (2006.01)

(52) U.S. Cl. ............ 361/697; 361/679.47; 361/679.48; 361/679.54; 361/695; 361/702; 361/704; 361/719; 165/185

(58) Field of Classification Search ................
361/679.46–679.49, 690, 694–695, 697, 361/702, 704, 709, 719; 165/80.2–80.3, 165/185; 174/16.1, 16.3; 454/184
See application file for complete search history.

(56) References Cited

U.S. PATENT DOCUMENTS

| | | | | |
|---|---|---|---|---|
| 6,065,530 | A * | 5/2000 | Austin et al. ............... | 165/80.3 |
| 6,180,436 | B1 * | 1/2001 | Koors et al. ................. | 438/117 |
| 6,348,748 | B1 * | 2/2002 | Yamamoto ................... | 310/62 |
| 6,365,964 | B1 * | 4/2002 | Koors et al. ................. | 257/718 |
| 6,430,042 | B1 * | 8/2002 | Ohashi et al. .......... | 361/679.49 |
| 6,652,223 | B1 | 11/2003 | Horng | |
| 6,771,507 | B1 * | 8/2004 | Belady et al. ............... | 361/704 |
| 6,998,706 | B2 * | 2/2006 | Lawlyes ..................... | 257/712 |
| 7,120,020 | B2 | 10/2006 | Carter | |
| 6,982,481 | B1 | 11/2006 | Sonderegger | |
| 7,289,320 | B2 * | 10/2007 | Chang et al. ................ | 361/690 |
| 7,307,844 | B2 | 12/2007 | Wu | |
| 7,436,661 | B2 * | 10/2008 | Fong et al. .................. | 361/695 |
| 7,606,027 | B2 * | 10/2009 | Takasou ..................... | 361/695 |
| 2002/0134532 | A1 * | 9/2002 | Hirano et al. .............. | 165/80.3 |
| 2002/0144809 | A1 * | 10/2002 | Siu ............................ | 165/185 |
| 2006/0221573 | A1 * | 10/2006 | Li ............................... | 361/704 |
| 2007/0151712 | A1 | 7/2007 | Foster | |
| 2010/0079940 | A1 * | 4/2010 | Mongia et al. ......... | 361/679.49 |

FOREIGN PATENT DOCUMENTS

EP    1945014 A1 *    7/2008

\* cited by examiner

*Primary Examiner*—Robert J Hoffberg

(57) ABSTRACT

The invention provides an electronic assembly and heat sink comprising:
(a) a thermally-conductive layer having a peripherally-indented top surface and a preferably non-indented bottom surface; and
(b) one or more thermally-conductive elements that extend outwardly from the peripherally-indented top surface of the thermally-conductive layer and that are adapted for thermal communication with one or more heat-generating circuit components for the transfer of a heat load from the heat-generating circuit components, through the peripherally-indented top surface of the thermally-conductive layer, and to the preferably non-indented bottom surface of the thermally-conductive layer.

10 Claims, 4 Drawing Sheets

ELECTRONIC ASSEMBLY AND HEAT SINK

RELATED APPLICATION

This nonprovisional patent application claims priority from U.S. Provisional Patent Application No. 61/011,185, filed Jan. 15, 2008. The complete contents of U.S. Provisional Patent Application No. 61/011,185 are hereby incorporated by reference in their entirety.

BACKGROUND OF THE INVENTION

Integrated circuits (IC's) used in electronic systems generate a relatively significant amount of heat during operation. Heat impedes the operation of the electronic systems and proves difficult to dissipate, especially when heat-emanating circuitry is encased within a small area. Efforts to address this problem have met with mixed success, particularly in devices such as thin-client computers ("TCC's") that use small footprint IC's.

In one approach, TCC's are cooled by a heat exchanger and fan assembly that is positioned in the rear of the TCC. For example, U.S. Pat. No. 6,652,223 describes a horizontal convection fan structure that can be used to cool a TCC. Heat exchanger and fan assemblies often rely on several exchanger fin layers for heat transfer. U.S. Pat. No. 6,982,481 describes an apparatus that uses fins to dissipate heat by convection; U.S. Pat. No. 7,120,020 describes high capacity bent fin heat sink; and United States Patent Application Document No. 20070151712 describes a heat sink comprising heat-dissipating fins connected to a cylindrical thermal transport.

Relatively large copper pipes are also sometimes employed in TCC's to connect heat-generating components to a heat exchanger and fan assembly at the back of the unit. The large size of these pipes, however, makes it impractical to use them to connect more than two heat-generating components to the heat exchanger and fan assembly. As a result, several heat-generating components within the computer are left un-cooled, leading to many problems in both system design and system reliability.

The effectiveness of the aforementioned heat exchange systems is limited by the by the small area in which heat-emanating circuitry is confined. A thin-client form factor design proves incompatible with either a large heat exchanger fin surface area or alternative cooling apparatus such as the shaped metal piece apparatus disclosed in U.S. Pat. No. 7,307,844.

Accordingly, the need exists for an electronic assembly and heat sink that will effectively transfer and dissipate heat from small footprint electronic device circuitry.

SUMMARY OF THE INVENTION

The instant invention provides an electronic assembly and heat sink that effectively dissipates heat generated by an electronic system's heat-generating circuit components. Electronic assemblies and heat sinks of the invention prove particularly useful in TCC's that use small footprint IC's.

In one embodiment, the invention provides a heat sink comprising:
(a) a thermally-conductive layer having a peripherally-indented top surface and a preferably non-indented bottom surface; and
(b) one or more thermally-conductive elements that extend outwardly from the peripherally-indented top surface of the thermally-conductive layer and that are adapted for thermal communication with one or more heat-generating circuit components for the transfer of a heat load from the heat-generating circuit components, through the peripherally-indented top surface of the thermally-conductive layer, and to the preferably non-indented bottom surface of the thermally-conductive layer.

In another embodiment, the invention provides an electronic assembly comprising:
(a) a substrate (e.g., printed circuit board (PCB)) that has a top surface and a bottom surface and that supports one or more heat-generating circuit components (e.g., IC components) that extend outwardly from the bottom surface of the substrate;
(b) a thermally-conductive layer having a peripherally-indented top surface and a preferably non-indented bottom surface, wherein the a peripherally-indented top surface is positioned opposite the bottom surface of the substrate; and
(c) one or more thermally-conductive elements that extend outwardly from the peripherally-indented top surface of the thermally-conductive layer and that are adapted for thermal communication with the one or more heat-generating circuit components for the transfer of a heat load from the heat-generating circuit components, through the peripherally-indented top surface of the thermally-conductive layer, and to the preferably non-indented bottom surface of the thermally-conductive layer.

An electronic assembly and heat sink of the invention can also include a cooling channel which is positioned beneath the preferably non-indented surface of the thermally-conductive layer and which is adapted for the flow of a cooling fluid therethrough.

Electronic assemblies and heat sinks of the invention transfer heat relatively uniformly from heat-generating circuit components and obviate the need for space-consuming heat exchanger fins or pipes.

Thus, an electronic assembly or heat sink of the invention will cover a substantial portion of an IC footprint and ensure that only those IC components which require cooling come directly into contact with the thermally-conductive layer.

Electronic assemblies and heat sinks of the invention are particularly useful in TCC's which employ heat-intensive graphics cards. For example, by including contact points on the thermally-conductive layer in a predetermined position, manufacturers can design add-on cards which can take advantage of the assembly's internal heat-exchanging system.

These and other advantages and features of the instant invention are explained further in the following detailed description.

DETAILED DESCRIPTION OF THE INVENTION

Figure 1:
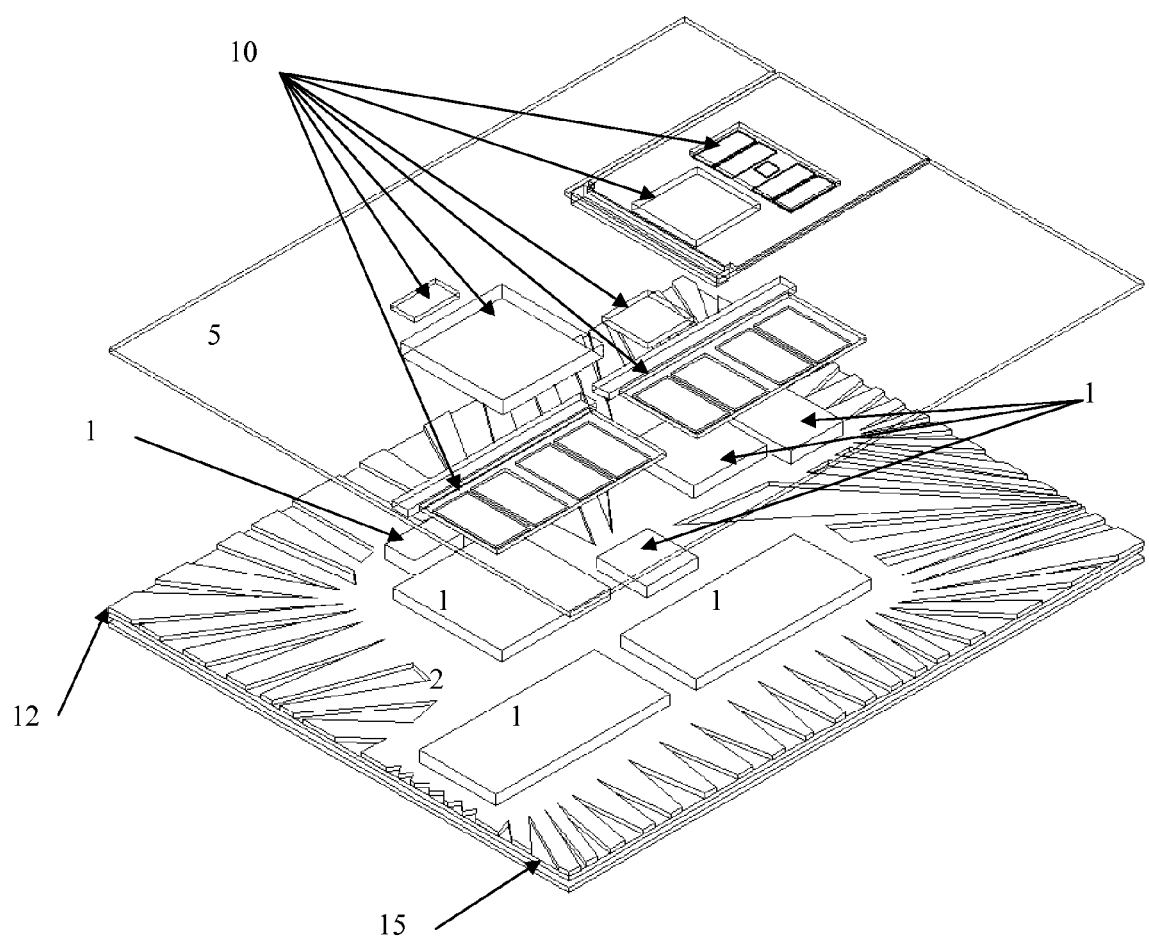
FIG. 1 is a perspective view which illustrates the positioning of IC components relative to the thermally-conductive layer in an embodiment of the invention.

"Heat-generating circuit components" include, but are not limited to, CPU's, System Memory (RAM), the Northbridge, the Southbridge, as well as the Graphics processor (GPU) and the memory associated with it (Video RAM). Some of these components, as well as additional "Heat-generating circuit components" may be located on an "add-on" card. An "add-on" card is a printed circuit board which contains specialized circuitry for tasks such as video processing and can be connected and removed from the computer in order to facilitate replacement and upgrade.

A "substrate" includes but is not limited to a printed circuit board (PCB).

"Electronic systems" include but are not limited to the electronic systems listed in U.S. Pat. No. 7,120,020 (e.g., computers, wireless communication devices, PDA's, and MP3 players).

In one embodiment, the thermally-conductive layer is comprised of a first thermally-conductive, peripherally-indented piece and a second thermally-conductive, non-indented piece that is affixed to the first thermally-conductive, indented piece. The first thermally-conductive, peripherally-indented piece and the second thermally-conductive, non-indented piece may be affixed in a variety of ways (e.g., by using thermally-conductive solder, screws, or thermally-conductive adhesives).

In certain embodiments, the thermally-conductive elements that extend outwardly from the peripherally-indented top surface of the thermally-conductive layer are an integral part of the peripherally-indented top surface of the thermally-conductive layer. In other embodiments, the thermally-conductive elements are separate components that are affixed to the peripherally-indented top surface of the thermally-conductive layer (e.g., by using thermally-conductive solder, screws, or thermally-conductive adhesives).

In certain embodiments, the electronic assembly or heat sink includes a cooling channel which is positioned beneath the preferably non-indented surface of the thermally-conductive layer. One or more horizontal fans may be positioned within the cooling channel to facilitate the flow of a cooling air stream which, when heated, is exhausted from the electronic device.

FIGS. 1-4 illustrate embodiments of the invention which transfer heat from substrate-mounted IC components used, e.g., in a TCC. In the illustrated embodiments, the indentations on the peripherally-indented top surface of the thermally-conductive layer are configured in a serrated pattern. Preferably, the peripherally-indented top surface of the thermally-conductive layer evenly transfers heat relatively uniformly across the non-indented bottom surface of the thermally-conductive layer. Indentation patterns may vary based upon, e.g., the positioning and heat load of the heat-generating circuit components. Thus, the design of the peripherally-indented top surface of the thermally-conductive layer may vary from system to system, and may take either a serrated or non-serrated form as appropriate. Insulation may be inserted into some or all of the indentations of the peripherally-indented top surface of the thermally-conductive layer to vary heat load distribution as well as to better direct the heat being transferred across the electronic assembly away from heat-generating components.

Referring to FIG. 1, substrate 5 substantially covers peripherally-indented top surface 2 and non-indented bottom surface 15 of thermally-conductive layer 12. Thermally-conductive elements 1 are positioned on peripherally-indented top surface 2 for conductive heat transfer from IC components 10 located on the bottom of substrate 5.

Thermally-conductive layer 12 and thermally-conductive elements 1 can be made from any thermally-conductive materials, e.g., a heat-conductive metal such as copper or a heat-conductive ceramic. In preferred embodiments, thermally-conductive layer 12 and thermally-conductive elements 1 are made from a heat-conductive metal. Additionally, it is possible to use thermo-electric coolers as thermally-conductive elements 1 in systems, or on specific components, which require greater cooling.

Thermally-conductive elements 1 can be affixed to peripherally-indented top surface 2 in a variety of ways (e.g., by using thermally-conductive solder, screws, or thermally-conductive adhesives). Thermally-conductive elements can be coated with a high thermal conductivity electrical insulator films (e.g., aluminum oxide, beryllium oxide, cerium oxide, and cobalt oxide) to prevent shorting of the heat-generating circuit components. See U.S. Pat. No. 7,310,036.

Indentation patterns of peripherally-indented top surface 2 can vary depending on factors such as heat-generating circuit component heat load, the positioning of IC components 10, and the nature of materials used to make the thermally-conductive layer 2 and thermally-conductive elements 1 in order that the heat generated by IC components 10 is distributed relatively evenly to non-indented bottom surface 15. The heat load transferred from peripherally-indented top surface 2 to non-indented bottom surface 15 can vary depending on the location and heat load of IC components 10, the surface area, number, and distribution of indentations on peripherally-indented top surface 2, and the composition of thermally-conductive layer 12. The aforementioned variables can be used in programs such as FLOTHERM® (Flomerics, Inc., Marlborough, Mass.) and FEMLAB® heat transfer module (Comsol, Inc., Burlington, Mass.) to model, e.g., the heat load transferred from the peripherally-indented top surface 2 to non-indented bottom surface 15.

Figure 2:
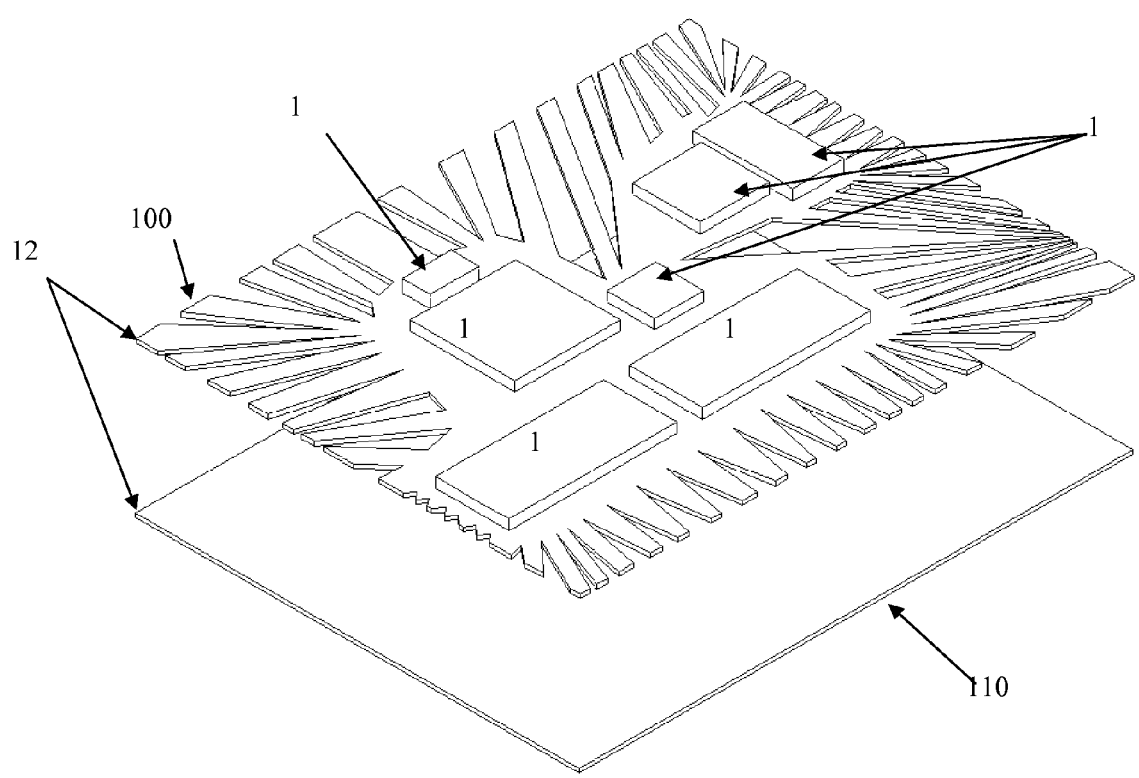
FIG. 2 is a perspective view which illustrates an embodiment of the invention in which a thermally-conductive layer is comprised of a first thermally-conductive, peripherally-indented piece and a second thermally-conductive, non-indented piece that is affixed to the first thermally-conductive, peripherally-indented piece.

FIG. 2 is a perspective view which illustrates an embodiment of the invention in which thermally-conductive layer 12 is comprised of first thermally-conductive, peripherally-indented piece 100 and a second thermally-conductive, non-indented piece 110 that is affixed to the bottom surface of first thermally-conductive, peripherally-indented piece 100. Thermally-conductive elements 1 are positioned on, and are either affixed to or an integral part of, the top surface of first thermally-conductive, peripherally-indented piece 100. First thermally-conductive, peripherally-indented piece 100 and a second thermally-conductive, non-indented piece 110 can be made from a variety of thermally-conductive materials, e.g., a heat-conductive metal such as copper or a heat-conductive ceramic or composite material. In preferred embodiments, first thermally-conductive, peripherally-indented piece 100 and a second thermally-conductive, non-indented piece 110 are made from a thermally-conductive metal. First thermally-conductive, peripherally-indented piece 100 and a second thermally-conductive, non-indented piece 110 may be affixed in a variety of ways (e.g., preferably by using thermally-conductive solder, screws, or adhesive).

In order to increase heat exchange efficiency, design elements such as ridges may be added to the bottom of second thermally-conductive, non-indented piece 110 to increase its heat transfer surface area.

Figure 3:
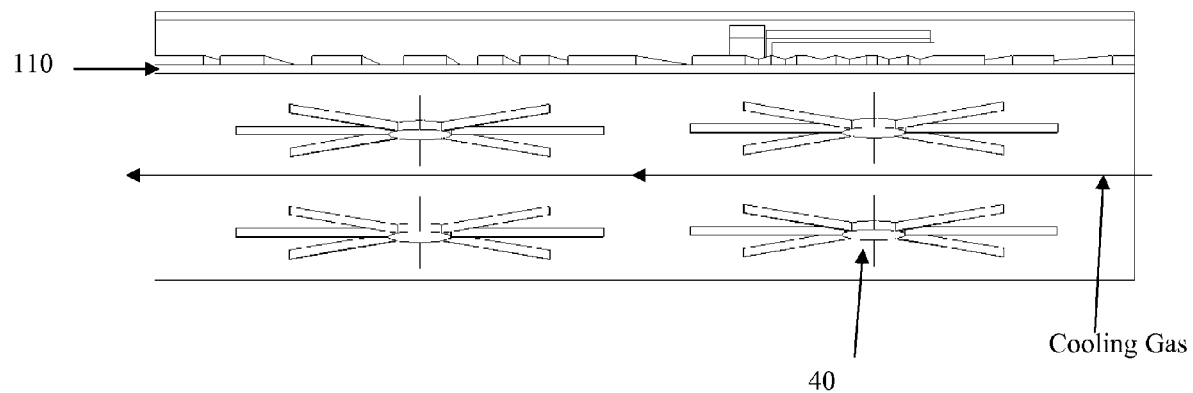
FIG. 3 is a side-view which illustrates an embodiment of the invention in which cooling fluid flows along a non-indented surface of the thermally-conductive layer and through a cooling channel.

FIG. 3 is a side-view which illustrates how a cooling fluid (e.g., air) flows along the bottom surface of thermally-conductive non-indented piece 110. Heat which is transferred by thermally-conductive non-indented piece 110 heats the cooling fluid, which is drawn by horizontal fans 40 from a vent (not shown) in the front of the system and exhausted out a similar vent (not shown) at the back of the system.

Figure 4:
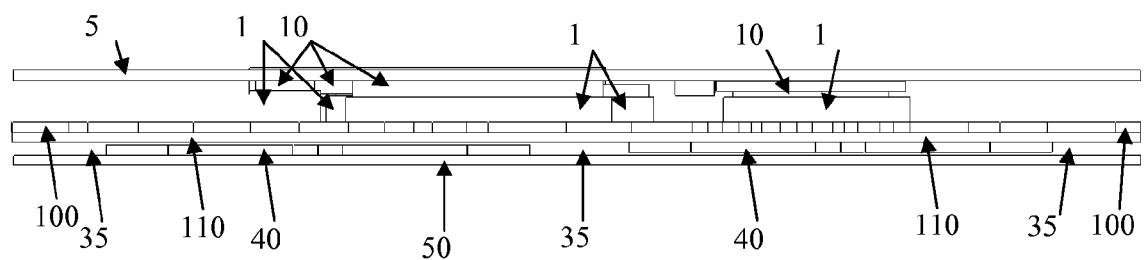
FIG. 4 is a cross-sectional view which illustrates the use of an embodiment of the invention in a laptop computer.

FIG. 4 is a cross-sectional view which illustrates the use of an embodiment of the invention in a laptop computer. Referring to FIG. 4, PCB 5 substantially covers first thermally-conductive, peripherally-indented piece 100. Heat-producing IC components 10 are affixed to the bottom of PCB 5 and are positioned for thermal conductivity with thermally-conductive elements 1. Thermally-conductive elements 1 are supported by and positioned on first thermally-conductive, peripherally-indented piece 100 for heat transfer from IC components 10 to peripherally-indented piece 100. First thermally-conductive, peripherally-indented piece 100 overlays, is affixed to, and transfers heat to, second thermally-conductive, non-indented piece 110. Cooling channel 35 which is defined by the space between thermally-conductive, non-indented piece 110 and the bottom 50 of the laptop computer conveys by horizontal fan 40 a cooling fluid along the bottom surface of second thermally-conductive, non-indented piece 110 and heated fluid is drawn into and vented from a duct (not pictured) at the front of the laptop computer.

The aforementioned detailed description is illustrative and is not limiting.

What is claimed is:

1. A heat sink comprising: (a) a substantially planar, thermally-conductive layer having an indented top surface and a finless bottom surface, said indented top surface having a plurality of integral, co-planar heat transfer segments which extend towards all of peripheral edges of the indented top surface, each of the heat transfer segments extend from a central portion of the indented top surface to a peripheral edge of the all of peripheral edges, and adjacent heat transfer segments each define a recess of a plurality of recesses, the plurality of recesses extending to the all of peripheral edges of the indented top surface; and (b) one or more thermally-conductive elements that extend outwardly from the indented top surface, an elements top surface of the one or more thermally-conductive elements positioned opposite one or more heat-generating circuit components, and the one or more thermally-conductive elements provide for thermal communication with one or more heat-generating circuit components for the transfer of a heat load from the one or more heat-generating circuit components, through the one or more thermally-conductive elements, the indented top surface, and to the finless bottom surface.

2. The heat sink of claim 1, wherein the heat sink further comprises a cooling channel which is positioned beneath the substantially planar, finless bottom surface of the thermally-conductive layer and which is adapted for the flow of a cooling gas therethrough.

3. The heat sink of claim 2, wherein the heat sink further comprises one or more cooling gas conveyance means disposed within the cooling channel.

4. The heat sink of claim 3, wherein the cooling gas conveyance means is a fan.

5. An electronic system comprising the heat sink of claim 1.

6. A TCC comprising the heat sink of claim 1.

7. An electronic assembly comprising: (a) a substrate that has a substrate top surface and a substrate bottom surface and that supports one or more heat-generating circuit components that extend outwardly from the substrate bottom surface; (b) a substantially planar, thermally-conductive layer having an indented top surface and a finless bottom surface, said indented top surface having a plurality of integral, co-planar heat transfer segments which extend towards all of peripheral edges of the indented top surface, each of the heat transfer segments extend from a central portion of the indented top surface to a peripheral edge of the all of peripheral edges, and adjacent heat transfer segments each define a recess of a plurality of recesses, the plurality of recesses extending to the all of peripheral edges of the indented top surface, wherein the indented top surface is positioned opposite the substrate bottom surface; and (c) one or more thermally-conductive elements that extend outwardly from the indented top surface and the one or more thermally-conductive elements provide for thermal communication with the one or more heat-generating circuit components for the transfer of a heat load from the one or more heat-generating circuit components, through the one or more thermally-conductive elements, the indented top surface, and to the finless bottom surface.

8. The electronic assembly of claim 7, wherein the electronic assembly further comprises a cooling channel which is positioned beneath the substantially planar, finless bottom surface of the thermally-conductive layer and which is adapted for the flow of a cooling gas therethrough.

9. The electronic assembly of claim 8, wherein electronic assembly further comprises one or more cooling gas conveyance means disposed within the cooling channel.

10. The electronic assembly of claim 9, wherein the cooling gas conveyance means is a fan.

* * * * *